United States Patent
Doyle et al.

(10) Patent No.: US 12,075,702 B2
(45) Date of Patent: Aug. 27, 2024

(54) CONDUCTIVE PARTICLE INTERCONNECT SWITCH

(71) Applicant: International Business Machines Corporation, Armonk, NY (US)

(72) Inventors: Matthew Doyle, Chatfield, MN (US); Joseph Kuczynski, North Port, FL (US); Patrick Egan, Rochester, MN (US); Jeffrey N. Judd, Oronoco, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 17/811,374

(22) Filed: Jul. 8, 2022

(65) Prior Publication Data

US 2022/0344569 A1    Oct. 27, 2022

Related U.S. Application Data

(62) Division of application No. 16/415,949, filed on May 17, 2019, now Pat. No. 11,411,166.

(51) Int. Cl.
*H01L 41/04* (2006.01)
*H01H 1/029* (2006.01)
(Continued)

(52) U.S. Cl.
CPC ............ *H10N 30/20* (2023.02); *H01H 1/029* (2013.01); *H01H 57/00* (2013.01); *H10N 30/857* (2023.02)

(58) Field of Classification Search
CPC ............................. H10N 30/20; H10N 30/857
(Continued)

(56) References Cited

U.S. PATENT DOCUMENTS 6,545,384 B1 *   4/2003   Pelrine .................... F02G 1/043
                                                              977/788
9,231,186 B2     1/2016   Thomas
(Continued)

FOREIGN PATENT DOCUMENTS

| CN | 108198665 A | 6/2018 |
| WO | 2014202687 A1 | 12/2014 |

OTHER PUBLICATIONS

Doyle et al., "Conductive Particle Interconnect Switch," U.S. Appl. No. 17/811,364, filed Jul. 8, 2022.
(Continued)

*Primary Examiner* — Derek J Rosenau
(74) *Attorney, Agent, or Firm* — IBM Patents+ Team

(57) ABSTRACT

Provided is an apparatus comprising a conductive particle interconnect (CPI). The CPI includes an elastomeric carrier and a plurality of conductive particles dispersed therein. The elastomeric carrier includes an electroactive polymer (EAP) configured to move between a first position and a second position in response to an electrical field. The CPI is configured to exhibit a first electrical resistance when the EAP is in the first position and a second electrical resistance when the EAP is in the second position. The apparatus further comprises one or more electrodes electrically coupled to the CPI. The electrodes are configured to generate the electrical field within the CPI. The apparatus further comprises one or more insulators coupled to the CPI. The one or more insulators are configured to constrain expansion of the CPI in at least one direction.

14 Claims, 6 Drawing Sheets

(51) Int. Cl.
  *H01H 57/00* (2006.01)
  *H10N 30/20* (2023.01)
  *H10N 30/857* (2023.01)

(58) Field of Classification Search
  USPC .......................................................... 310/800
  See application file for complete search history.

(56) References Cited

U.S. PATENT DOCUMENTS

| | | | |
|---|---|---|---|
| 9,231,328 | B2 | 1/2016 | Rathburn |
| 2002/0130673 | A1* | 9/2002 | Pelrine .................. B60N 2/002 324/727 |
| 2006/0238079 | A1 | 10/2006 | Pei et al. |
| 2006/0261709 | A1* | 11/2006 | Kato ......................... F03G 7/06 310/367 |
| 2010/0109486 | A1 | 5/2010 | Polyakov et al. |
| 2015/0240124 | A1 | 8/2015 | Skov |
| 2018/0198053 | A1 | 7/2018 | Doyle |
| 2018/0254404 | A1 | 9/2018 | Ubachs et al. |
| 2020/0365792 | A1 | 11/2020 | Doyle |
| 2020/0365793 | A1 | 11/2020 | Doyle et al. |

OTHER PUBLICATIONS

Lacour et al., "Photoconductive high-voltage switches of thin-film amorphous silicon for EAP actuators," Proceedings of SPIE 5051, Smart Structures and Materials 2003: Electroactive Polymer Actuators and Devices (EAPAD), Jul. 28, 2003, 8 pgs.
List of IBM Patents or Patent Applications Treated as Related, Jul. 5, 2022, 2 pgs.
Michel, S., "A comparison between silicone and acrylic elastomers as dielectric materials in electroactive polymer actuators—Michel—2010—Polymer International," https://onlinelibrary.wiley.com/doi/abs/10.1002/pi.2751, Dec. 18, 2009, 1 pg., abstract only.
Wikipedia, "Electroactive polymers," https://en.wikipedia.org/wiki/Electroactive_polymers#Dielectric, printed Feb. 15, 2019, 9 pgs.

* cited by examiner

CONDUCTIVE PARTICLE INTERCONNECT SWITCH

BACKGROUND

The present disclosure relates generally to the field of electrical switches, and more particularly to switches having electroactive polymers and conductive particle interconnects.

Switches are often used to control the flow of electricity between various components in a circuit. Switches typically include contacts that form electrical connections with one or more components. A mechanical switch can be thought of as having a variable resistance that changes from a large or effectively infinite resistance (e.g., an open, whereby electricity does not freely flow through the switch) when the switch contacts are not touching to a low or near zero resistance (e.g., a short, whereby electricity freely flows) when the switch contacts are touching. Other switching structures, such as transistors, also exhibit a variable resistance.

SUMMARY

Embodiments of the present disclosure include an apparatus. The apparatus comprises a conductive particle interconnect (CPI). The CPI includes an elastomeric carrier and a plurality of conductive particles dispersed therein. The elastomeric carrier includes an electroactive polymer (EAP) configured to move between a first position and a second position in response to an electrical field. The CPI is configured to exhibit a first electrical resistance when the EAP is in the first position and a second electrical resistance when the EAP is in the second position. The apparatus further comprises one or more electrodes electrically coupled to the CPI. The electrodes are configured to generate the electrical field within the CPI. The apparatus further comprises one or more insulators coupled to the CPI. The one or more insulators are configured to constrain expansion of the CPI in at least one direction.

Additional embodiments of the present disclosure include a method, system, and computer program product. The method comprises determining a target state of a CPI that includes an elastomeric carrier having an EAP and a plurality of conductive particles. The EAP is configured to move between a first position and a second position in response to application of an electrical field. The second position is associated with the target state. The method further comprises generating an input signal based on the target state. The input signal is transmitted to a voltage source. Transmission of the input signal to the voltage source causes the voltage source to apply the electrical field to the EAP to move the EAP to the second position.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1A:
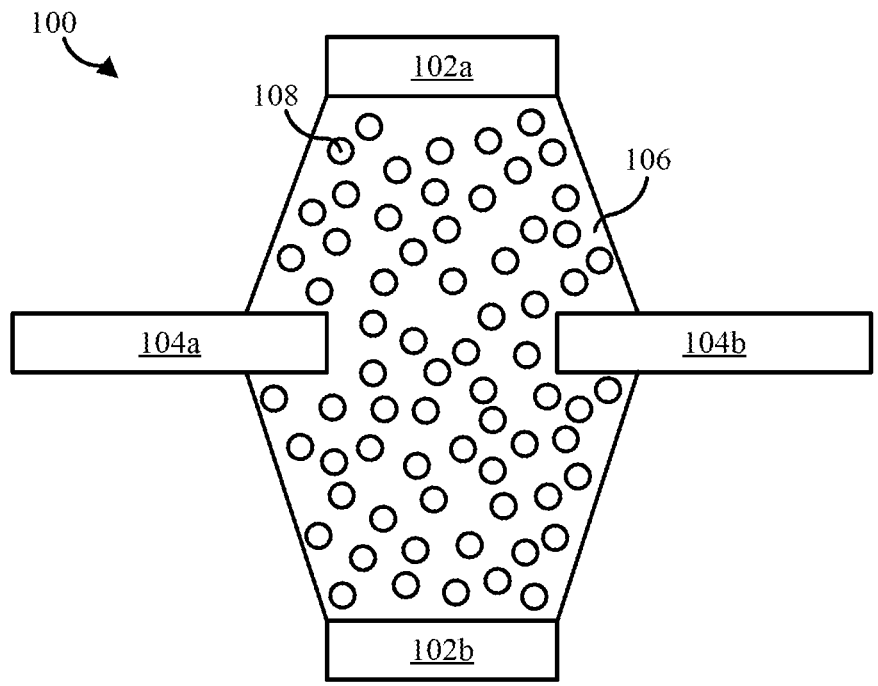
FIGS. 1A and 1B are diagrams illustrating two states of a first example switch that includes an electroactive polymer (EAP) and a conductive particle interconnect (CPI), in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electrical switches, and in particular to switches having electroactive polymers and conductive particle interconnects. While the present disclosure is not necessarily limited to such applications, various aspects of the disclosure may be appreciated through a discussion of various examples using this context.

The present disclosure relates to switches that include electroactive polymer (EAP) structures and a conducting particle interconnect (CPI). A CPI may be formed by doping a compliant elastomeric carrier (e.g., a polymer) with conductive particles. When the conductive particles include metal particles, the CPI may be referred to as a metalized particle interconnect (MPI). Metal particles (or flakes) used in MPIs include, but are not limited to, copper, silver, gold, and/or nickel, as well as various alloys and plated materials.

The resistance of a CPI can be modified through compression/expansion of the CPI (e.g., of the CPI's polymer base). For example, as a CPI is compressed, the average gap between conductive particles is decreased due to the same number of particles being disposed within a smaller volume. This increases the number of conductive particles that are in contact with each other, thereby reducing the resistance of the CPI and allowing electric current to flow more easily within, on, or through the CPI. Conversely, when compression decreases, the volume of the CPI increases, the conductive particles move farther apart, the number of conductive particles that are in contact with each other decreases, and the resistance of the CPI increases.

An electro-active polymer (EAP) is a polymer or a set of polymers (e.g., a co-polymer system or a laminate of polymers) that exhibits a change of size or shape when subjected to an electric field. In an EAP structure, an EAP is positioned between two electrodes such that the electrodes can apply the electric field to the EAP. Examples of EAPs include ferroelectric polymers (e.g., a polyvinylidene fluoride), electrostrictive graft polymers, and ionic EAPs (e.g., intrinsically conducting polymers, such as polyacetylene and polyphenylene vinylene) or ionic polymer-metal composites, which are similar to dielectric EAPs except that the polymer itself is conductive. Some EAPs retain their shape/size after removal of the electric field, while others revert back to their default shape/size when the electric field is removed. Furthermore, the magnitude of the size/shape change of an EAP may depend on the strength of the electric field.

In some embodiments, a CPI is combined with an EAP structure (or multiple EAP structures) to form a polymer-based switch. The switch may be used, for example, to toggle downstream circuits between active (e.g., "on") and inactive (e.g., "off") states, or to toggle inputs to downstream circuits (e.g., one or more inputs to an AND gate) between a 1 and a 0. The EAP structure(s) act to increase or decrease the compression of the CPI, thereby changing the resistance of the CPI. In other words, the CPI acts as a variable resistance based on the amount of force applied to the CPI by the EAP structure(s). Using these properties, the CPI can be used as a switch. For example, the switch is "closed" when the CPI has a first resistance (e.g., a low resistance), and the switch is "open" when the CPI has a second resistance (e.g., a high resistance). The switch may also exhibit a variety of resistance values between a fully open resistance value (e.g., a maximum resistance value of the CPI) and a fully closed resistance value (e.g., a minimum resistance value of the CPI). Thus, the switch can have multiple positions including fully open, fully closed, and one or more intermediate positions. This may be achieved by varying the strength of the electric field that the EAP structure(s) are subjected to.

In some embodiments, the switch may be actuated (e.g., opened or closed) by application of a voltage across the EAP structure(s). The applied voltage generates an electric field which causes the EAP to contract, expand, and/or change shape. The EAP structure(s) may be integrated with the CPI such that movement of the EAP, relative to the CPI, due to the electric field changes the force applied to the CPI. For example, if the switch is closed, the switch may be opened by movement of the EAP that reduces the compressive force applied to the CPI, which increases the resistance of the CPI. Similarly, the switch may be toggled from the open state to the closed state by application of a voltage that causes the EAP to increase the compressive force applied to the CPI, which reduces the resistance of the CPI. The switch can be configured as a normally open switch, which may also be referred to as a fail open switch (e.g., a switch that is open unless a voltage is applied to the EAP to close it), as a normally closed switch, which may also be referred to as a fail closed switch (e.g., a switch that is closed unless a voltage is applied to the EAP to open it), or a switch that is in an intermediate state (e.g., not fully open or closed) when no voltage is applied to the EAP.

Figure 1B:
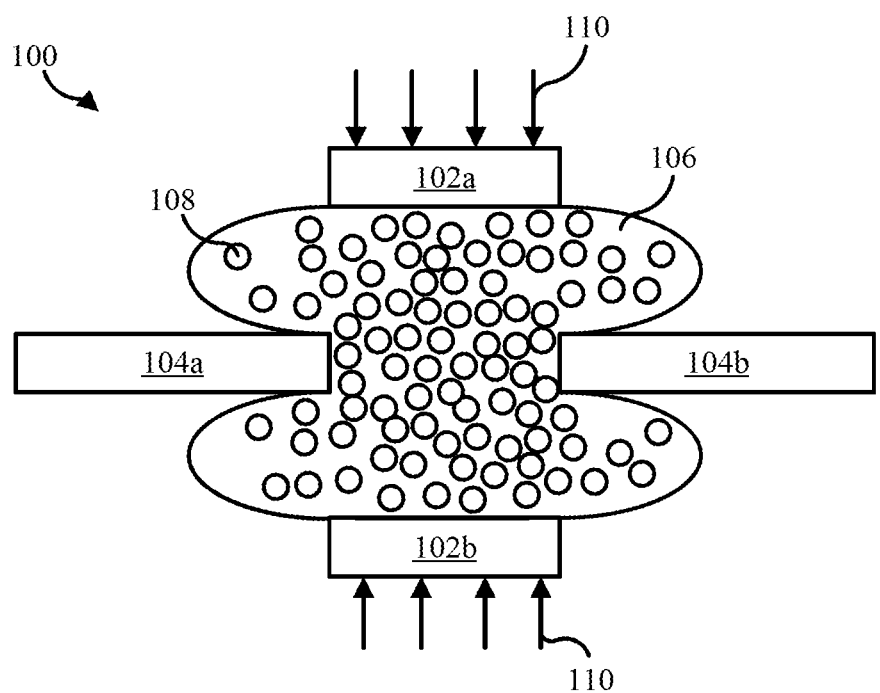

In some embodiments, a silicone dielectric elastomer is filled with a conductive metal particle below the percolation limit. In other words, the conductive metal particles are directly embedded in a polymer (e.g., a polymer matrix) that includes, or is made out of, the EAP (e.g., the silicone dielectric elastomer). As used herein, the percolation limit of the CPI includes an amount or concentration of conductive particles above which the CPI's resistance drops significantly (e.g., measurably, such that electricity begins flowing through the CPI). By keeping the amount of conductive metal particles below the percolation limit, the CPI starts in a fail-open state (i.e., acts as an open switch when no voltage is applied to the EAP). Once the actuation voltage is applied to the EAP(s), the elastomer is placed under compressive strain, the metal particles provide a continuous conduction path, and the percolation limit is exceeded, resulting in a conducting elastomer. Note that dielectric EAPs require no power to keep the actuator at a given position. An example EAP-actuated CPI switch according to these embodiments is illustrated in FIGS. 1A and 1B.

In some embodiments, such as those applications that undergo thermal cycling that could experience an electrical glitch on the cooling cycle due to contraction of the CPI when cooled, an EAP-actuated CPI may be fabricated with the filler loading exceeding the percolation limit. That is, the EAP-actuated CPI may have sufficient conductive filler (e.g., particles) to be conductive even prior to the application of any force from the EAP. Using temperature sensing circuitry already present in the system, a DC bias voltage may be applied to the EAP-actuated CPI only toward the low end of the cooling cycle in order to provide positive normal force on the contacts (e.g., to counteract the constriction caused by the cooler temperature).

In some embodiments, a separate EAP is used to constrict the CPI, which may include a normal (i.e., not electroactive) polymer matrix in which conductive particles are embedded. In these embodiments, a different class of EAP other than a dielectric elastomer may be utilized. When dielectric elastomers are not used, the EAP may require continuous application of the actuation voltage in order to retain its compressed form. An example EAP-actuated CPI switch where a separate EAP is used to constrict a CPI is illustrated in FIGS. 2A-3B.

Embodiments of the present disclosure include an EAP-actuated CPI having an EAP elastomeric carrier. The EAP-actuated CPI comprises a CPI having an elastomeric carrier and a plurality of conductive particles dispersed therein. The elastomeric carrier includes an EAP configured to move between a first position and a second position in response to an electrical field. The CPI is configured to exhibit a first electrical resistance when the EAP is in the first position and a second electrical resistance when the EAP is in the second position. The apparatus further comprises one or more electrodes electrically coupled to the CPI. The electrodes are configured to generate the electrical field within the CPI. The apparatus further comprises one or more insulators coupled to the CPI. The one or more insulators are configured to constrain expansion of the CPI in at least one direction.

Additional embodiments of the present disclosure include a method, system, and computer program product for controlling an EAP-actuated CPI having an EAP elastomeric carrier. The method comprises determining a target state of a CPI that includes an elastomeric carrier having an EAP and a plurality of conductive particles. The EAP is configured to move between a first position and a second position in response to application of an electrical field. The second position is associated with the target state. The method further comprises generating an input signal based on the target state. The input signal is transmitted to a voltage source. Transmission of the input signal to the voltage source causes the voltage source to apply the electrical field to the EAP to move the EAP to the second position.

Embodiments of the present disclosure include an EAP-actuated CPI having an EAP structure that is external to the CPI. The EAP-actuated CPI comprises a CPI and an EAP structure. The CPI includes an elastomeric carrier and a plurality of conductive particles dispersed therein. The EAP structure is disposed around at least a portion of the CPI. The EAP structure is configured to move between a first position and a second position in response to an electrical field. The CPI is configured to exhibit a first electrical resistance when the EAP structure is in the first position and a second, different electrical resistance when the EAP structure is in the second position.

Additional embodiments of the present disclosure include a method, system, and computer program product for controlling an EAP-actuated CPI having an EAP structure that is external to the CPI. The method comprises determining a target state of a CPI. The method further comprises generating an input signal based on the target state. The input signal is transmitted to a voltage source to cause an EAP disposed around the CPI to apply a force on the CPI. The applied force causes the CPI to transition to the target state.

Turning now to the figures, FIGS. 1A and 1B are diagrams illustrating two states of a first example switch 100 that includes an electroactive polymer (EAP) and a conductive particle interconnect (CPI), in accordance with embodiments of the present disclosure. The EAP-actuated CPI switch 100 illustrated in FIGS. 1A and 1B includes a CPI having an elastomeric carrier comprising an EAP matrix 106 (e.g., a silicone dielectric elastomer matrix) in which conductive particles 108 (e.g., conductive metal particles) are embedded. The EAP matrix 106 is in contact with a pair of electrodes 102a, 102b and an insulator material 104a, 104b.

As shown in FIG. 1A, the EAP-actuated CPI switch 100 may initially start in an open state. In other words, the EAP-actuated CPI switch 100 may be a "fail-open" switch that does not allow current to flow between signal contacts (not shown) when no electric field is applied to the EAP by the electrodes 102a, 102b. The EAP-actuated CPI switch may be created by filling an EAP matrix 106 with conductive particles 108 below the percolation limit.

When an actuation voltage is applied to the EAP matrix 106 through the electrodes 102a, 102b, the EAP matrix 106 is placed under a compressive strain and contracts along the directions indicated by the arrows 110, as shown in FIG. 1B. The contraction, which is aided by the insulator(s) 104a, 104b, causes the density of conductive particles 108 to increase, reducing the distance between conductive particles 108 and increasing the number of conductive particles that are in physical contact with each other. This creates a conductive path through the EAP-actuated CPI switch 100, causing the EAP-actuated CPI switch 100 to transition to the closed state. In embodiments that use a dielectric EAP as the EAP matrix 106, the actuation voltage can be removed after the EAP-actuated CPI switch 100 changes state because dielectric EAPs retain their shape after removal of the electric field.

Use of this type of CPI may eliminate the electrical glitches that can occur when a traditional CPI is subjected to thermal cycling. That is, when the system enters a cooling cycle, the interconnect may experience intermittent electrical contact resulting in opens. Although the FIGS. 1A and 1B depict the electrodes on the top and bottom of the CPI, one skilled in the art will appreciate that many different electrode configurations are possible. In order to prevent the electrical glitches that may occur upon cooling, the electrodes may be positioned on the sides of the CPI so that upon actuation, the sides are compressed and a resulting normal force (in the z-axis or thickness of the CPI) is applied to the mating contacts. If the CPI is actuated at the low end of the operating temperature range, a positive normal force may be present throughout thermal cycling.

In some embodiments, the EAP-actuated CPI switch 100 may have more than two states. For example, application of a first voltage may result in the EAP-actuated CPI switch 100 being in a first state with a first electrical resistance (e.g., an open state), application of a second voltage may result in the EAP-actuated CPI switch 100 being in a second state with a second electrical resistance (e.g., a closed state), and application of a third voltage that is between the first and second voltages causes the EAP-actuated CPI switch 100 to exhibit a third electrical resistance that is between the first electrical resistance and the second electrical resistance. Thus, the EAP-actuated CPI switch 100 may have a continuous or discrete range of states between and including the first state of FIG. 1A and the second state of FIG. 1B.

Figure 2B:
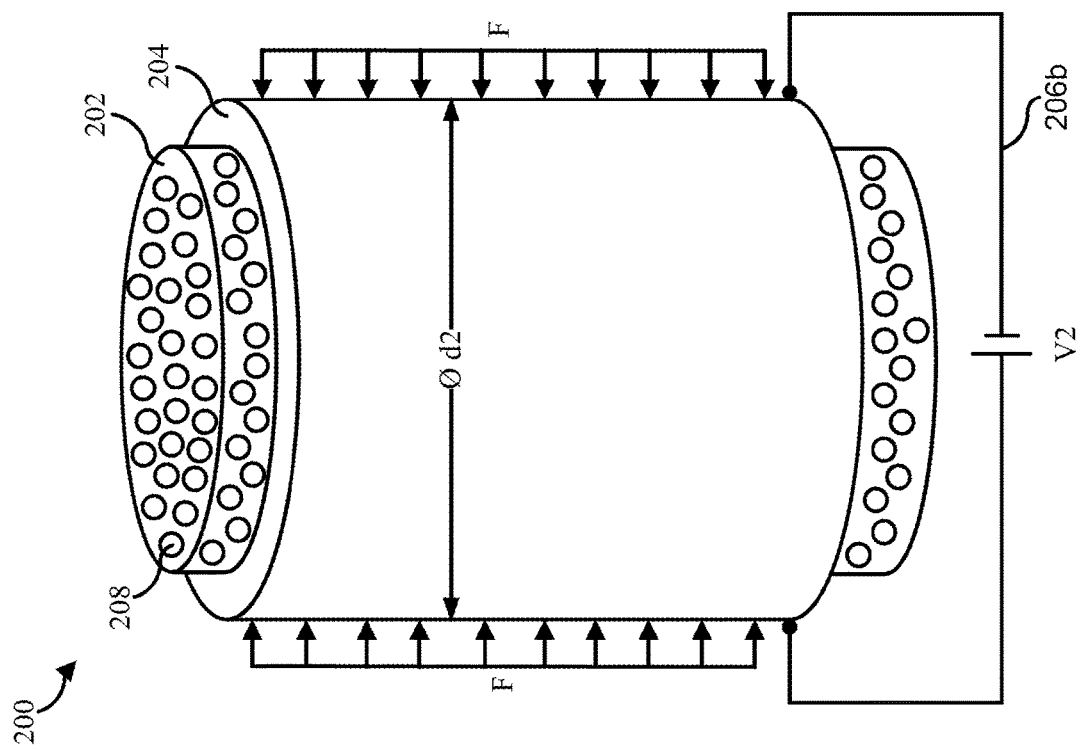
FIGS. 2A and 2B are diagrams illustrating two states of a second example switch that includes an EAP and a CPI, in accordance with embodiments of the present disclosure.
Figure 2A:
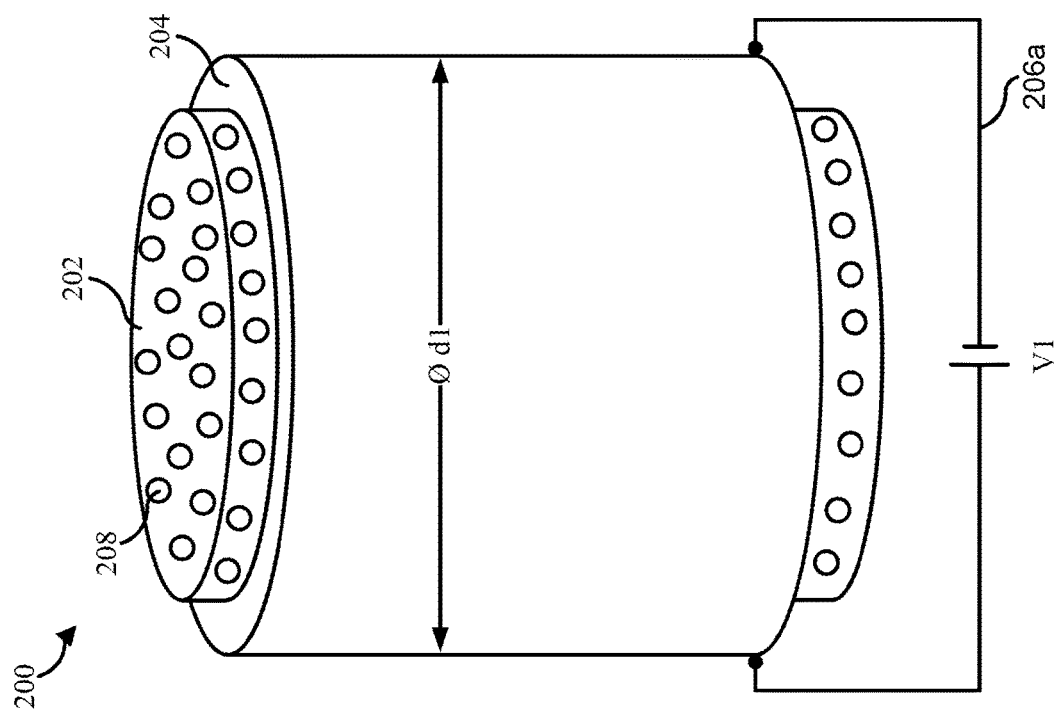

Turning now to FIGS. 2A and 2B, depicted are diagrams illustrating two states of a second example switch 200 that includes an EAP and a CPI, in accordance with embodiments of the present disclosure. The EAP-actuated CPI switch 200 illustrated in FIGS. 2A and 2B includes a CPI 202 (e.g., a polymer in which conductive particles 208 (e.g., conductive metal particles) are embedded). A discrete EAP structure 204 surrounds at least part of the CPI 202. The EAP structure 204 may be electrically connected to a pair of electrodes (not shown) that are configured to apply an actuation voltage to the EAP structure 204.

As shown in FIG. 2A, the EAP-actuated CPI switch 200 may initially start in an open state when subjected to a first voltage V1 206a. In other words, the EAP-actuated CPI switch may be a "fail-open" switch that does not allow current to flow between the signal contacts when V1 is applied to the EAP. In this state, the EAP structure 204 may have a first diameter d1. The CPI 202 may be created by filling the elastomeric carrier (e.g., polymer) with conductive particles 208 below the percolation limit.

When an actuation voltage V2 206b is applied to the EAP structure 204 by control circuitry (e.g., a processor, not shown), the EAP structure 204 generates a compressive force F, as shown in FIG. 2B. The compressive force F causes the EAP structure 204 to constrict. After constriction, the EAP structure 204 has a second diameter d2. The second diameter d2 is less than the first diameter d1. Accordingly, the CPI 202 is likewise placed under compression and constricts. The constriction of the CPI 202 causes the density of conductive particles 208 to increase due to the decreased volume occupied by the CPI, reducing the distance between conductive particles 208 and increasing the number of conductive particles that are in physical contact with each other. This creates a conductive path through the CPI 202, reducing the electrical resistance of the CPI 202 (e.g., causing the EAP-actuated CPI switch 200 to transition to the closed state).

In some embodiments, the EAP structure 204 may include a dielectric EAP. In these embodiments, the actuation voltage can be removed after the EAP-actuated CPI switch 200 changes states because dielectric EAPs retain their shape after removal of the electric field. In order to change the EAP-actuated CPI switch 200 to the original state (e.g., transition the EAP back to its original shape), a different electric field must be applied to the dielectric EAP. In other embodiments, the actuation voltage may be continuously applied to the EAP structure 204 to keep the EAP structure 204 in the constricted state shown in FIG. 2B.

In some embodiments, the EAP-actuated CPI switch 200 may have more than two states. For example, application of a first voltage may result in the EAP-actuated CPI switch 200 being in a first state with a first electrical resistance (e.g., an open state), application of a second voltage may result in the EAP-actuated CPI switch 200 being in a second state with a second electrical resistance (e.g., a closed state), and application of a third voltage that is between the first and second voltages causes the EAP-actuated CPI switch 200 to exhibit a third electrical resistance that is between the first electrical resistance and the second electrical resistance. Thus, the EAP-actuated CPI switch 200 may have a continuous or discrete range of states between and including the first state of FIG. 2A and the second state of FIG. 2B.

Figure 3B:
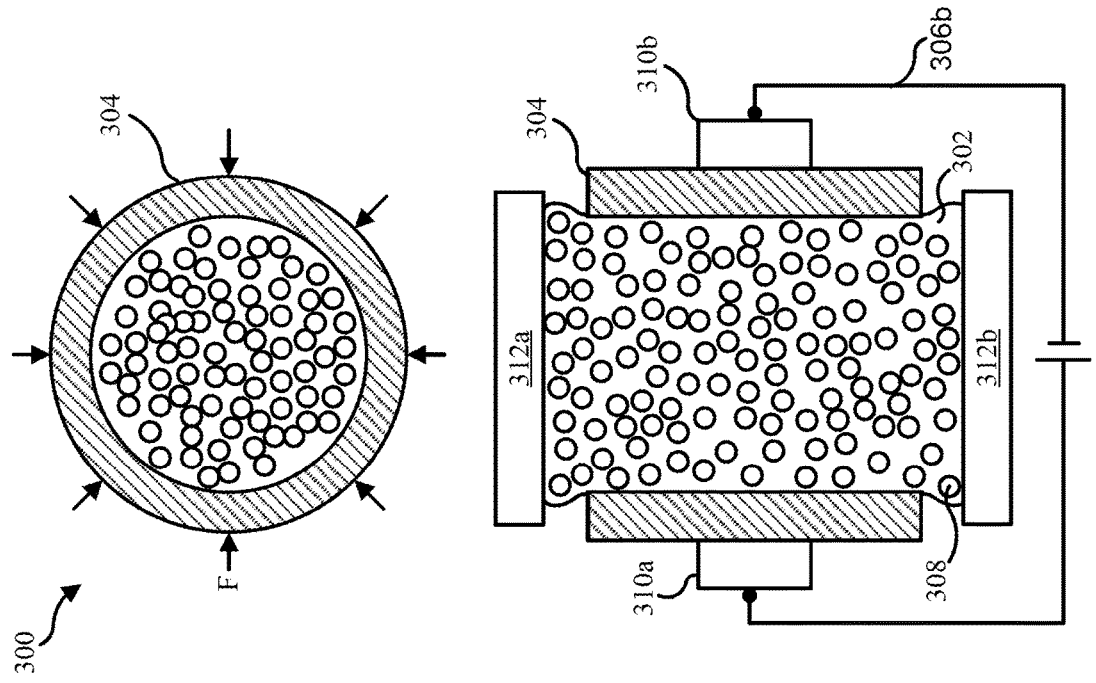
FIGS. 3A and 3B are sectional view diagrams illustrating two states of a third example switch that includes an EAP and a CPI, in accordance with embodiments of the present disclosure.
Figure 3A:
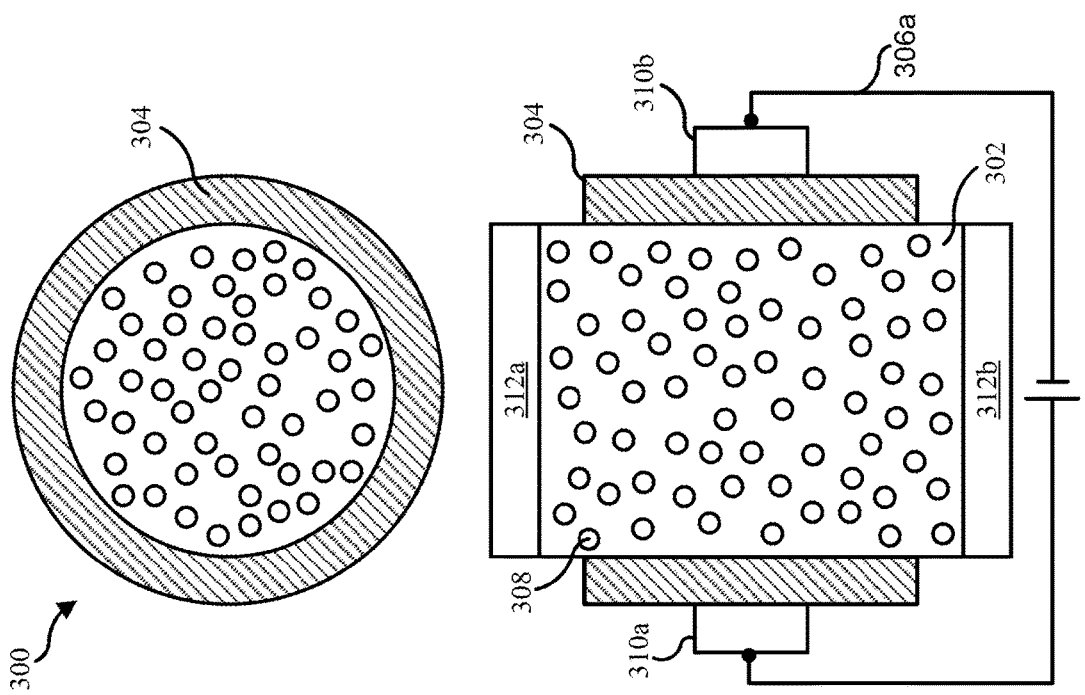

Turning now to FIGS. 3A and 3B, depicted are sectional view diagrams illustrating a top view and a side view of a third example switch 300 in two states, in accordance with embodiments of the present disclosure. The third switch 300 may be the same as, or substantially similar to, the second switch 200 illustrated in FIGS. 2A and 2B. The EAP-actuated CPI switch 300 illustrated in FIGS. 3A and 3B includes a CPI 302. The CPI may, for example, be made of a polymer in which conductive particles 308 (e.g., conductive metal particles) are embedded. A discrete EAP structure 304 surrounds at least part of the CPI 302. The EAP structure 304 may be electrically connected to a pair of electrodes 310a, 310b that are configured to apply an actuation voltage to the EAP structure 304. Additionally, the EAP-actuated CPI switch 300 includes two signal contacts 312a, 312b.

As shown in FIG. 3A, the EAP-actuated CPI switch 300 may initially start in an open state when subjected to a first voltage 306a. In this state, the distance between conductive particles 308 may be sufficiently large to prevent current from flowing though the EAP-actuated CPI switch 300 (e.g., between signal contacts 312a and 312b). The CPI 302 may be created by filling a polymer with conductive particles 308 below the percolation limit. As shown in FIG. 3A, the EAP structure 304 is a hollow tube that surrounds the CPI 302.

When an actuation voltage 306b is applied to the EAP structure 304 by control circuitry (e.g., a processor, not shown), the EAP structure 304 generates a compressive force F, as shown in FIG. 3B. The actuation voltage 306b may be applied to the EAP structure 304 using the electrodes 310a, 310b. The compressive force F causes the EAP structure 304 to constrict, squeezing the CPI 302. Accordingly, the CPI 302, is likewise placed under compression and constricts. The constriction of the CPI 302 causes the density of conductive particles 308 to increase, reducing the distance between conductive particles 308 and increasing the number of conductive particles that are in physical contact with each other. This creates a conductive path through the CPI 302, reducing the electrical resistance of the CPI 302 (e.g., causing the EAP-actuated CPI switch 300 to transition to the closed state). A current is then able to flow through the EAP-actuated CPI switch 300 and into the signal contacts 312a, 312b.

In some embodiments, the constriction of the EAP structure 304 and the CPI 302 along one or two dimensions (as shown in FIG. 2B) causes expansion of the CPI 302 in a third dimension. In other words, the CPI 302 is squeezed by the EAP 304 that surrounds it, causing the CPI to expand towards the signal contacts 312a, 312b. This expansion provides a positive normal force on the contacts 312a, 312b. Accordingly, the contact forces between the CPI 302 and the signal contacts 312a, 312b is increased. This reduces the electrical resistance at the boundaries between the CPI 302 and the contacts 312a, 312 (e.g., deceases the contact resistance), thereby increasing the electrical conductivity of the CPI 302 at the interface between the CPI 302 and the signal contacts 312a, 312b.

In some embodiments, the EAP-actuated CPI switch 300 may have more than two states. For example, application of a first voltage may result in the EAP-actuated CPI switch 300 being in a first state with a first electrical resistance (e.g., an open state), application of a second voltage may result in the EAP-actuated CPI switch 300 being in a second state with a second electrical resistance (e.g., a closed state), and application of a third voltage that is between the first and second voltages causes the EAP-actuated CPI switch 300 to exhibit a third electrical resistance that is between the first electrical resistance and the second electrical resistance. Thus, the EAP-actuated CPI switch 300 may have a continuous or discrete range of states between and including the first state of FIG. 3A and the second state of FIG. 3B.

In some embodiments, a circuit may be coupled to any of the above described switches 100, 200, 300 to generate an output signal based on the electrical resistance of the CPI. For example, the circuit may include a voltage source that applies a known or fixed voltage across conductive contacts that are coupled to the CPI. In this example, the output signal generated by the circuit may correspond to or indicate current that flows through the CPI responsive to the voltage applied across the conductive contacts. Since the resistance of the CPI changes based on the position of the EAP structure, the current of the output signal corresponds to or indicates the position of the EAP structure.

For example, when the EAP structure 304 is in the first position, as illustrated in FIG. 3A, the CPI 302 has a first electrical resistance (R1) resulting in the circuit generating a first output signal (S1) (e.g., a first current). Further, when the EAP structure 304 is in the second position, as illustrated in FIG. 3B, the CPI 302 has a second electrical resistance (R2) resulting in the circuit generating a second output signal (S2) (e.g., a second current). Because the second electrical resistance (R2) is less than the first electrical resistance (R1) and the voltage applied across the conductive contacts 312a, 312b is fixed or known, the second output signal (S2) has a higher current than the first output signal (S1).

Thus, the EAP structure 304 and CPI 302 can be arranged to form a switch 300 or variable resistance device in order to generate an output signal. EAP structures respond quickly to applied electrical fields. Thus, if the control signal is modulated (e.g., time varying), the output signal varies based on the modulation of the control signal.

Each of the switches described above (e.g., switches 100, 200 and 300) is illustrated as including a single CPI coupled to, or having as its polymer matrix, at least one EAP structure. However, in some implementations, a switch may include more than one CPI. In such implementations, each CPI may exhibit a corresponding electrical characteristic (e.g., electrical resistance) based on a position of one or more EAP structures.

While each of the above switches (e.g., switches 100, 200, and 300) use EAPs that constrict when subjected to an electric field, in some embodiments, an EAP that expands when subjected to an electric field may be used as the EAP matrix (e.g., in FIGS. 1A and 1B) and/or as the discrete EAP structure (e.g., in FIGS. 2A and 2B). In these embodiments, the EAP-actuated CPI switch may start in the closed state. When the actuation voltage is applied, the EAP matrix may expand, causing the EAP-actuated CPI switch to transition to the open state by relaxing or eliminating the compressive strain on the CPI.

Figure 4:
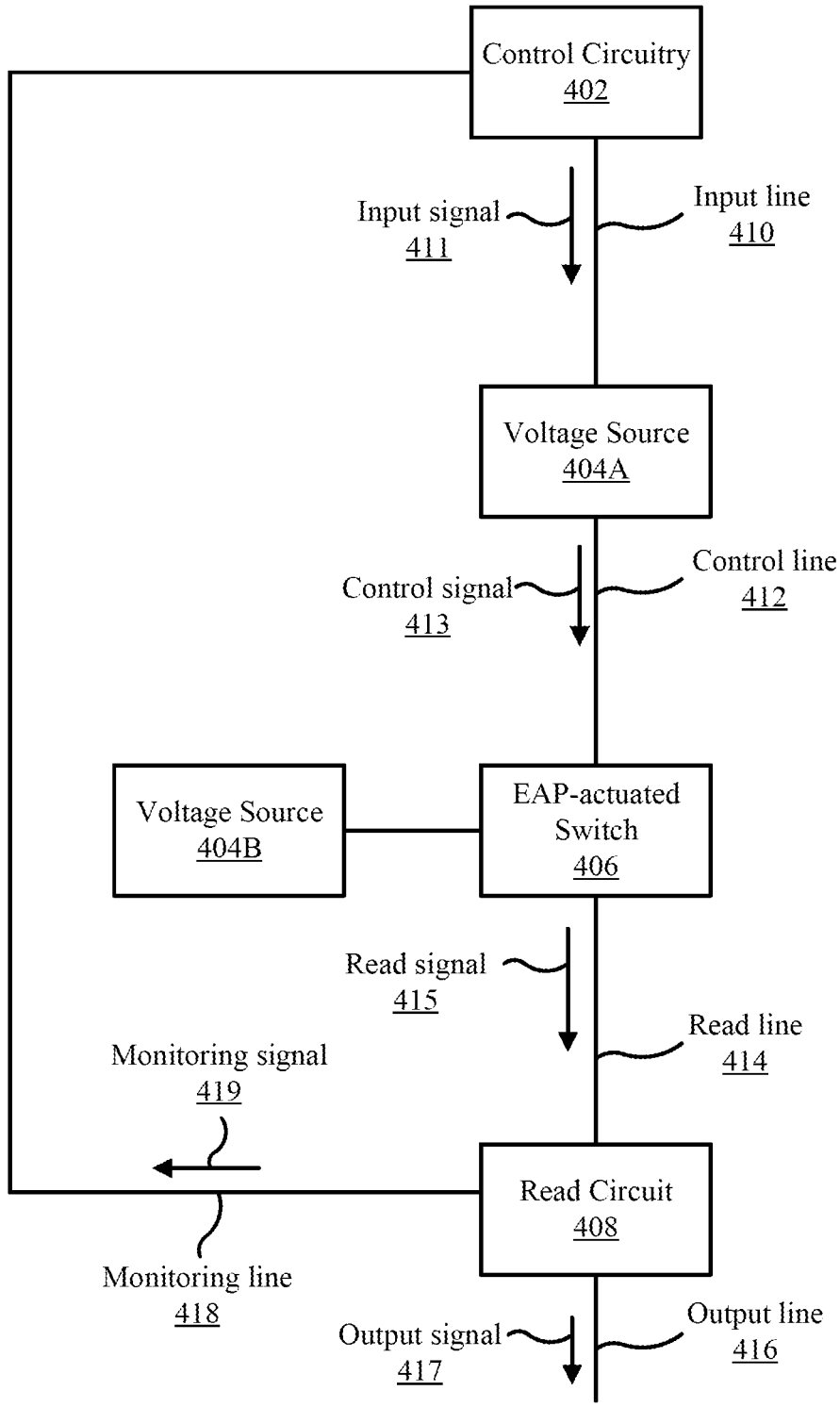
FIG. 4 is a block diagram of a system that includes an EAP-actuated CPI switch coupled to other circuitry for controlling and using the switch, in accordance with embodiments of the present disclosure.

Turning now to FIG. 4, depicted is a block diagram of a system 400 that includes a switch coupled to other circuitry for controlling and using the switch, in accordance with embodiments of the present disclosure. The switch of FIG. 4 is an EAP-actuated switch 406 that includes at least one CPI and at least one EAP. For example, the EAP-actuated switch 406 may correspond to, or include, the switch 100 of FIGS. 1A and 1B, the switch 200 of FIGS. 2A and 2B, or the switch 300 of FIGS. 3A and 3B.

The system 400 also includes control circuitry 402 that is coupled to a first voltage source 404A via an input line 410. In some embodiments, the control circuitry 402 is dedicated hardware for controlling the EAP-actuated CPI switch 406. In some embodiments, the control circuitry 402 includes a processor. The control circuitry 402 may also, or in the alternative, include a sensor, one or more logic gates, an application-specific integrated circuit (ASIC), a field programmable gate array (FPGA), or any other circuitry capable of generating an input signal 411 and providing the input signal 411 to the first voltage source 404A.

The first voltage source 404A is electrically connected to the EAP-actuated switch 406 via one or more control lines 412. The first voltage source 404A may provide a control signal 413 (or more than one control signal) to the EAP-actuated switch 406 via the control line 412 (or more than one control line) in order to cause the EAP-actuated switch 406 to change states. For example, when the EAP-actuated switch 406 corresponds to the switch 200, the first voltage source 404A may be configured to provide a single control signal 413 to the EAP structure 204 to toggle the EAP-actuated switch 406 between a first and second state (e.g., the open and closed states).

In some embodiments, such as those with multiple EAP structures, the first voltage source 404A may be configured to provide multiple control signals 413. For example, the first voltage source 404A may provide a first control signal to a first EAP structure, and it may also provide a second control signal to a second EAP structure. In other embodiments, the first voltage source 404A may be configured to provide the control signal to the first EAP structure, and another voltage source (e.g., the second voltage source 404B and/or another voltage source that is not shown) may independently provide the control signal to the second EAP structure.

In some embodiments, the system 400 includes a second voltage source 404B. The second voltage source 404B may be electrically connected to the EAP-actuated switch 406. While the first voltage source 404A may be used to generate an electric field across/within the EAP structures, the second voltage source 404B may apply a second voltage (e.g., a constant voltage) to the CPI portion of the EAP-actuated switch 406. This second voltage may drive the current through the EAP-actuated switch 406 and to downstream circuits when the EAP-actuated switch 406 is closed. In other words, the first voltage source 404A may control the state of the EAP-actuated switch 406 by applying an electric field to the EAP materials, whereas the second voltage source 404B may drive the current that flows through the EAP-actuated switch 406 and to other circuits.

The EAP-actuated switch 406 exhibits an electrical characteristic responsive to the control signal(s) 413. For example, the EAP-actuated switch 406 may exhibit a particular electrical resistance responsive to the control signal(s). The electrical characteristic may be detected by read circuitry 408. The read circuitry 408 may be coupled to the EAP-actuated switch 406 via one or more read lines 414. The read circuitry 408 may receive a read signal 415 (or read signals) from the EAP-actuated switch 406 and generate an output signal 417 indicative of the electrical characteristic of the EAP-actuated switch 406 based on the read signal(s) 415. For example, the read circuitry 408 (or the second voltage source 404B) may apply a known or fixed voltage signal to a CPI of the EAP-actuated switch 406. In this example, the output signal 417 may include a current that flows through the EAP-actuated switch 406 based on the known or fixed voltage and the resistance of the CPI. The output signal 417 may be provided, via an output line 416, to one or more other circuit components (not shown).

In some embodiments, a monitoring line 418 may connect the read circuitry 408 to the control circuitry 402. A monitoring signal 419 may be transmitted to the control circuitry 402 on the monitoring line 418. Using the monitoring signal 419, the control circuitry can determine whether the EAP-actuated switch 406 is in the proper state. For example, the monitoring signal 419 may show that no current is flowing between the EAP-actuated switch 406 and the read circuitry 408, indicating that the EAP-actuated switch 406 is in the open state. If the control circuitry 402 established that the EAP-actuated switch 406 should be in a different state (e.g., a closed state), the EAP-actuated switch 406 may, in response to receiving the monitoring signal 419, transmit a new input signal to the first voltage source 404A to increase (or decrease) the voltage applied by the first voltage source 404A to the EAP-actuated switch 406, thereby changing the electrical characteristics of the EAP-actuated switch 406.

In some embodiments, the system 400 may act as a variable resistor. Accordingly, the control circuitry 402 may determine, from the monitoring signal 419, the resistance of the EAP-actuated switch 406. The control circuitry 402 can then adjust, as necessary, the voltage applied to the EAP-actuated switch 406 by the first voltage source 404A the change the resistance of the EAP-actuated switch 406, and, therefore, of the system 400. This may be particularly useful when they system is subject to thermal cycling as the electrical characteristics of the EAP-actuated switch 406 may change with temperature changes.

Figure 5:
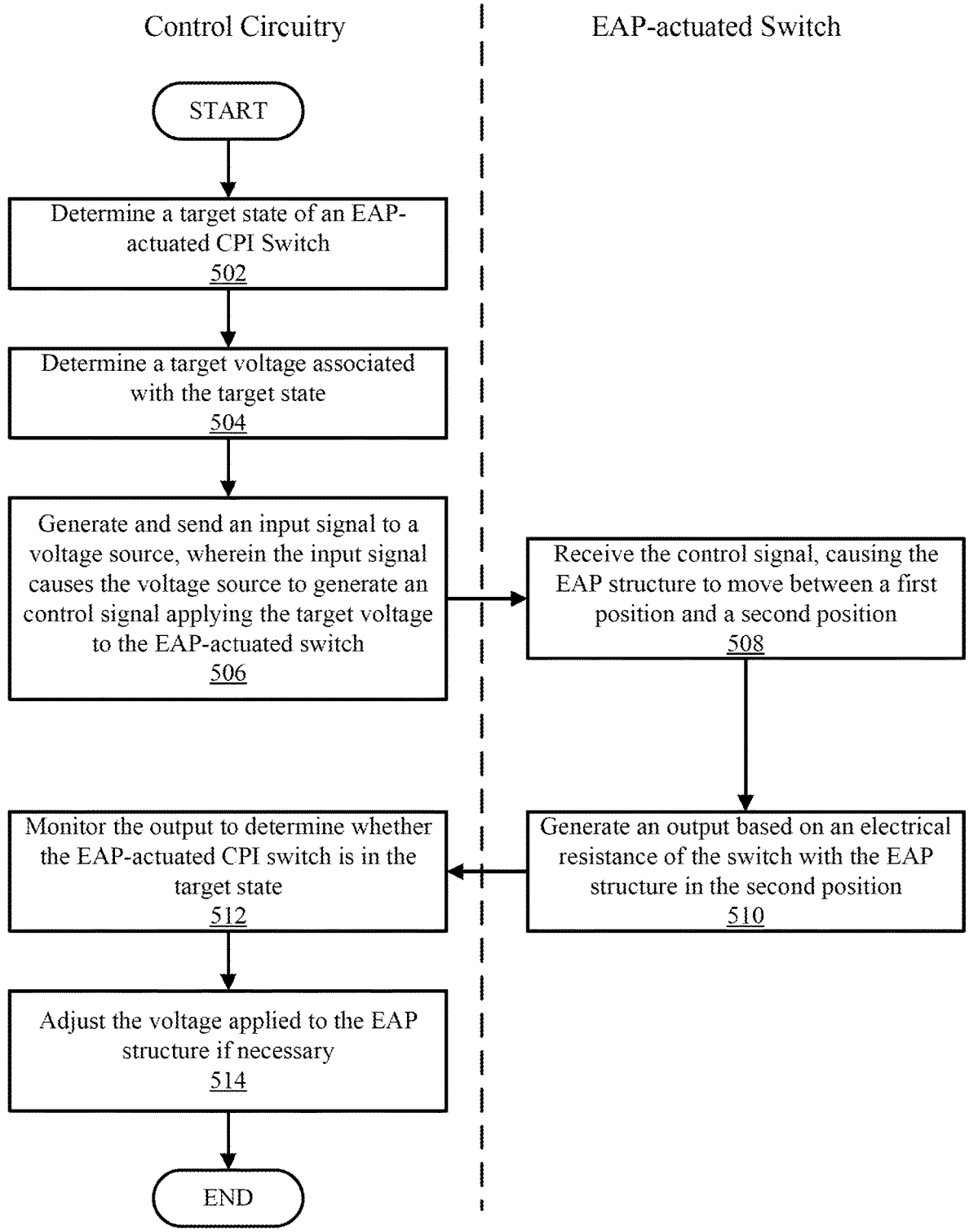
FIG. 5 illustrates a flowchart of an example method for using an EAP-actuated CPI switch, in accordance with embodiments of the present disclosure.

Turning now to FIG. 5, illustrated is a flowchart of an example method 500 of using an EAP-actuated CPI switch, in accordance with embodiments of the present disclosure. One or more operations of the method 500 may be performed by control circuitry, and one or more other operations may be performed by an EAP-actuated switch. The control circuitry may include a processor configured to perform one or more of the operations of the method 500, and/or specialized hardware (e.g., an ASIC). The EAP-actuated CPI switch may be any CPI switch that is actuated by an EAP, such as the switch 100 of FIGS. 1A and 1B, the switch 200 of FIGS. 2A and 2B, the switch 300 of FIGS. 3A and 3B, or the EAP-actuated CPI switch 406 of FIG. 4. For example, the switch may include an EAP structure that is configured to move between a first position and a second position responsive to an electrical field associated with a control signal.

The method 500 may begin at operation 502, wherein the control circuitry can determine the target state of an EAP-actuated CPI switch. The target state may be any of a fully open state, a fully closed state, or one or more intermediate states between fully open and fully closed. In some embodiments, the target state may be associated with a target voltage, which may be determined at operation 504. The target voltage is a voltage that causes the switch to transition to, or be placed in, the target state.

At operation 506, the control circuitry may generate and send an input signal to a voltage source. The input signal may instruct and/or cause the voltage source to generate a control signal that applies the target voltage to the switch.

At operation 508, the switch receives the control signal. For example, the control signal may be a voltage applied to an EAP structure of the switch, causing the EAP structure to move between a first position and a second position. In other words, the control signal may cause the switch to transition to the target state.

At operation 510, the switch generates, responsive to the control signal, an output (e.g., a current) based on an electrical resistance characteristic of a CPI of the switch. The CPI includes an elastomeric carrier and conductive particles dispersed therein. The CPI is configured to exhibit a first electrical resistance when the EAP structure is in the first position and to exhibit a second electrical resistance when the EAP structure is in the second position, where the first electrical resistance is different from the second electrical resistance.

In some embodiments, the output based on the electrical resistance characteristic of the CPI may correspond to or include the output signal 417 generated by the read circuitry 408 as depicted in FIG. 4. A circuitry (not shown) coupled to the output line 416 may receive the output signal 417 and perform an action based on the output signal 417. For example, the circuit coupled the output line 416 may include or have access to a lookup table or another data structure that indicates an action to be performed based on the output signal 417.

At operation 512, the control circuitry may monitor the output to determine whether the switch is in the target state. For example, the control circuitry may compare the output signal to an expected output signal to determine a resistance of the CPI. If the control circuitry determines that the switch is not in the target state, it may adjust the voltage applied to the EAP structure at operation 514. Additionally, or alternatively, the control circuitry may raise a flag or alert in response to determining that the switch is not in the target state. The alert may be visual (e.g., a light or other indicator), auditory, or textual. In some embodiments, the alert may be sent to an application (as opposed to a user). For example, if an application is using the CPI as a variable resistor and is controlling the resistance of the CPI, the application may be alerted in response to the CPI being in a wrong state. If the control circuitry determines that the switch is in the target state, the method 500 may end.

Figure 6:
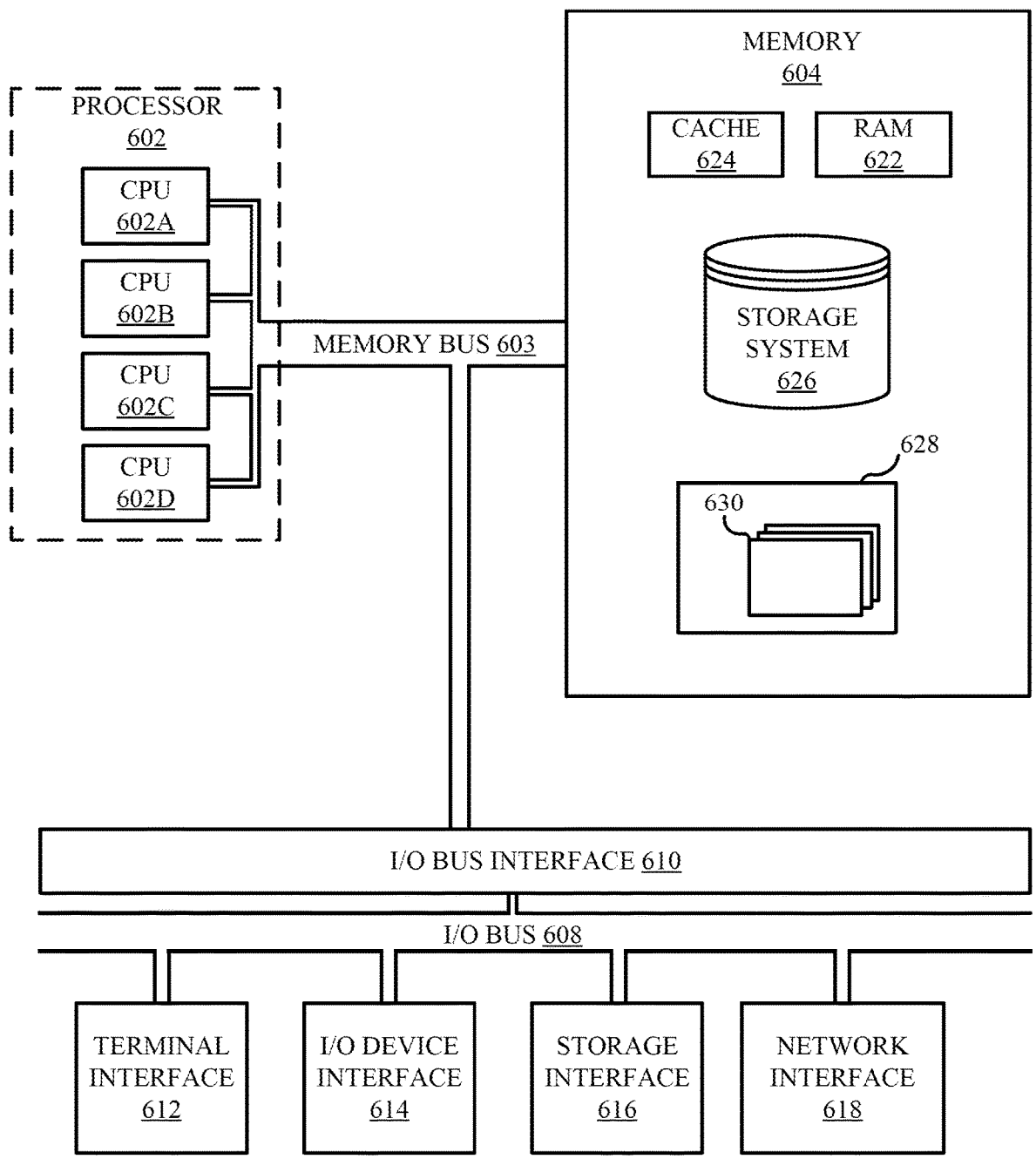
FIG. 6 illustrates a high-level block diagram of an example computer system that may be used in implementing one or more of the methods, tools, and modules, and any related functions, described herein, in accordance with embodiments of the present disclosure.

Turning now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive, an SD card, and/or a tape drive (reel/cassette). Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

In addition to embodiments described above, other embodiments having fewer operational steps, more operational steps, or different operational steps are contemplated.

Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to those skilled in the art. Therefore, it is intended that the following claims be interpreted as covering all such alterations and modifications as fall within the true spirit and scope of the invention.

What is claimed is:

1. A method comprising:
    determining a target state of a conductive particle interconnect (CPI), wherein the CPI includes an elastomeric carrier having an electroactive polymer (EAP) configured to move between a first position and a second position in response to application of an electrical field, the CPI further including a plurality of conductive particles, wherein the second position is associated with the target state;
    generating an input signal based on the target state;
    transmitting the input signal to a voltage source to cause the voltage source to apply the electrical field to the EAP to move the EAP to the second position;
    monitoring, after transmitting the input signal to the voltage source, an output of the CPI, wherein monitoring the output of the CPI includes determining a resistance of the CPI;
    determining, based on the monitoring, whether the CPI is in the target state; and
    adjusting, in response to determining that the CPI is not in the target state, a voltage applied to the EAP, wherein the adjusting includes:
        in response to the resistance of the CPI being too high, decreasing the voltage applied to the EAP to cause further compression of the CPI; and
        in response to the resistance of the CPI being too low, increasing the voltage applied to the EAP to reduce compression of the CPI.

2. The method of claim 1, the method further comprising:
    determining a target voltage associated with the target state, wherein the target voltage is a voltage that causes the EAP to move to the second position; and
    applying, by the voltage source, the target voltage to the EAP.

3. The method of claim 1, wherein the plurality of conductive particles includes one or more selected from the group consisting of copper particles, silver particles, gold particles, and nickel particles.

4. The method of claim 1, wherein:
    the CPI is configured to act as a switch having two or more states, each of the two or more states having an associated position of the EAP; and
    transmitting the input signal to the voltage source causes the EAP to move into a position associated with the target state.

5. The method of claim 1, wherein:
    the CPI is configured to exhibit a first electrical resistance when the EAP is in the first position and to exhibit a second electrical resistance when the EAP is in the second position.

6. The method of claim 1, the method further comprising:
- detecting that a temperature of the EAP is below a threshold;
- applying, in response to detecting that the temperature of the EAP is below the threshold, a DC bias voltage to the EAP, the DC bias voltage being a voltage that causes expansion of the EAP so as to offset constriction caused by the temperature.

7. A system comprising:
- a conductive particle interconnect (CPI) comprising:
  - an elastomeric carrier having an electroactive polymer (EAP), the EAP being configured to move between a first position and a second position in response to application of an electrical field; and
  - a plurality of conductive particles disposed in the elastomeric carrier;
- a voltage source coupled to the CPI;
- a temperature sensor configured to measure a temperature of the EAP; and
- processing logic configured to perform a method comprising:
  - determining a target state of the CPI, the target state being associated with the second position;
  - generating an input signal based on the target state;
  - transmitting the input signal to the voltage source to cause the voltage source to apply the electrical field to the CPI to move the EAP to the second position; and
  - applying, in response to detecting that the temperature of the EAP is below a threshold, using the voltage source, a DC bias voltage to the EAP, the DC bias voltage being a voltage that causes expansion of the EAP so as to offset constriction caused by the temperature.

8. The system of claim 7, wherein:
- the CPI is configured to act as a switch having two or more states, each of the two or more states having an associated position of the EAP.

9. The system of claim 7, wherein:
- the CPI is configured to exhibit a first electrical resistance when the EAP is in the first position and to exhibit a second electrical resistance when the EAP is in the second position.

10. The system of claim 7, wherein the plurality of conductive particles includes one or more selected from the group consisting of copper particles, silver particles, gold particles, and nickel particles.

11. The system of claim 7, wherein the method further comprises:
- monitoring, after transmitting the input signal to the voltage source, an output of the CPI; and
- determining, based on the monitoring, whether the CPI is in the target state.

12. A computer program product comprising a computer readable storage medium having program instructions embodied therewith, the program instructions executable by processor to cause the processor to perform a method comprising:
- determining a target state of a conductive particle interconnect (CPI), wherein the CPI includes an elastomeric carrier having an electroactive polymer (EAP) configured to move between a first position and a second position in response to application of an electrical field, the CPI further including a plurality of conductive particles, wherein the second position is associated with the target state;
- generating an input signal based on the target state;
- transmitting the input signal to a voltage source to cause the voltage source to apply the electrical field to the EAP to move the EAP to the second position;
- monitoring, after transmitting the input signal to the voltage source, an output of the CPI, wherein monitoring the output of the CPI includes determining a resistance of the CPI;
- determining, based on the monitoring, whether the CPI is in the target state; and
- adjusting, in response to determining that the CPI is not in the target state, a voltage applied to the EAP, wherein the adjusting includes:
  - in response to the resistance of the CPI being too high, increasing the voltage applied to the EAP to cause further compression of the CPI; and
  - in response to the resistance of the CPI being too low, decreasing the voltage applied to the EAP to reduce compression of the CPI.

13. The computer program product of claim 12, wherein the method further comprises:
- determining a target voltage associated with the target state, wherein the target voltage is a voltage that causes the EAP to move to the second position; and
- applying, by the voltage source, the target voltage to the EAP.

14. The computer program product of claim 12, wherein the plurality of conductive particles includes one or more selected from the group consisting of copper particles, silver particles, gold particles, and nickel particles.

* * * * *